United States Patent
Naundorf (10) Patent No.: US 10,551,807 B2
(45) Date of Patent: Feb. 4, 2020

(54) METHOD FOR CONNECTING AN INPUT/OUTPUT INTERFACE OF A TESTER EQUIPPED FOR CONTROL UNIT DEVELOPMENT

(71) Applicant: dSPACE digital signal processing and control engineering GmbH, Paderborn (DE)

(72) Inventor: Holger Naundorf, Paderborn (DE)

(73) Assignee: dSPACE digital signal processing and control engineering GmbH, Paderborn (DE)

( * ) Notice: Subject to any disclaimer, the term of this patent is extended or adjusted under 35 U.S.C. 154(b) by 690 days.

(21) Appl. No.: 15/233,187

(22) Filed: Aug. 10, 2016

(65) Prior Publication Data

US 2017/0045865 A1 Feb. 16, 2017

(30) Foreign Application Priority Data

Aug. 12, 2015 (EP) ..................................... 15180733

(51) Int. Cl.
*G05B 17/02* (2006.01)

(52) U.S. Cl.
CPC ................... *G05B 17/02* (2013.01)

(58) Field of Classification Search
CPC .. G01R 31/024; G05B 17/02; G05B 19/0423; G05B 19/0426; G05B 2219/23276; G05B 2219/23446; G05B 2219/23456; G05B 23/0254

See application file for complete search history.

(56) References Cited

U.S. PATENT DOCUMENTS

| | | | |
|---|---|---|---|
| 8,605,604 B1* | 12/2013 | Mohan | H04L 43/10 370/249 |
| 2003/0107834 A1* | 6/2003 | Fish | G06F 3/0626 360/69 |
| 2008/0091279 A1 | 4/2008 | Biermann et al. | |

(Continued)

FOREIGN PATENT DOCUMENTS

| | | |
|---|---|---|
| EP | 1 522 910 A1 | 4/2005 |
| EP | 1 901 146 A1 | 3/2008 |

OTHER PUBLICATIONS

Extended European Search Report for European Application No. 15180733.6 dated Jan. 27, 2016 with English translation.

(Continued)

*Primary Examiner* — Kenneth M Lo
*Assistant Examiner* — Mohammad A Rahman
(74) *Attorney, Agent, or Firm* — Muncy, Geissler, Olds & Lowe, P.C.

(57) ABSTRACT

A method is provided for connecting an input/output interface of a tester equipped for control unit development to a model of a technical system present in the tester using an already-existing basic test model of a control unit. The input/output interface is designed for connecting a hardware implementation of the control unit or for connecting a technical system to be controlled, and the model to be connected to the input/output interface is a test model of the technical system to be controlled or a test model of the control unit. The already-existing basic test model of the control unit is accessed, and at least one communication requirement is extracted from the basic test model of the control unit.

19 Claims, 4 Drawing Sheets

(56) References Cited

U.S. PATENT DOCUMENTS

2011/0131305 A1* 6/2011 Venzano ............... H04L 41/082
                                                        709/222
2015/0019191 A1* 1/2015 Maturana ............... G05B 17/02
                                                        703/13

OTHER PUBLICATIONS

Rex Klopfenstein, Jr., "Personal computer process loop simulator," ISA Transactions, vol. 33, No. 3, pp. 255-274 (Sep. 1, 1994).

* cited by examiner

METHOD FOR CONNECTING AN INPUT/OUTPUT INTERFACE OF A TESTER EQUIPPED FOR CONTROL UNIT DEVELOPMENT

This nonprovisional application claims priority under 35 U.S.C. § 119(a) to European Patent Application No. 15180733.6, which was filed in Europe on Aug. 12, 2015, and which is herein incorporated by reference.

BACKGROUND OF THE INVENTION

Field of the Invention

The present invention relates to the development of control units, such as are used in the automotive industry or in the aviation industry, for example, for controlling technical systems such as, e.g., engines or brakes. In particular, the present invention relates to testers that are used in the development process for the control unit.

Description of the Background Art

The development of control units has become a highly complex process. New control units and new control functions should thus be tested as early in the development process as possible in order to verify general functionality and to set the direction for further development. Towards the end of the development process, it is important to test the control unit, which has already undergone extensive development, as comprehensively as possible in order to make necessary modifications based on the test results before the control unit comes into use or enters mass production, so that it functions as desired under all conditions in later operation.

Three exemplary steps of the development process are described below. Testers are used in two of these exemplary development phases, while the third development phase that is described is executed in a purely computer-based manner.

So-called hardware-in-the-loop simulators (HIL simulators) are employed at a fairly late stage of the development process. Such HIL simulators contain a model of the technical system to be controlled, with the model being present in software. The HIL simulator also contains an input/output interface to which it is possible to connect the control unit, which has already undergone extensive development and is physically present as hardware, also called a hardware implementation of the control unit. The functionality of the control unit can now be tested in various simulation passes, wherein it is possible to observe how the model of the technical system to be controlled reacts to the signals of the control unit, and how the control unit reacts to events predefined by the model of the technical system to be controlled. In this process, it is possible to simulate not only normal operation, but also faults in the technical system to be controlled as well as faults in the control unit and faults in the communication between the control unit and the technical system to be controlled, such as, e.g., cable bridge, as well as faults in the power supply, such as, e.g., short circuits.

In contrast, so-called rapid control prototyping (RCP) is a development step that takes place more toward the start of the development process. In RCP, the tester is used in the role of the control unit. The tester contains a test model of the control unit. Because of the early stage of development, the test model of the control unit is still fairly rudimentary in comparison to the later, final control unit. Nor is any hardware implementation of the control unit normally in existence yet; instead, the test model of the control unit that is present in the tester is a software model. The tester can be connected through an input/output interface to the technical system to be controlled itself, or to the control unit that exists to date for the technical system to be controlled. In the first case, there is a direct connection between the control unit under test, in the form of a software model, and the technical system to be controlled, which is physically present. In the second case, the control unit that exists to date is the technical system to be controlled by the RCP tester. This control of the control unit that exists to date results in a modification of the control method of the control unit that exists to date, making it possible to test new control functionality by means of the externally connected RCP tester. This arrangement is also referred to as "bypassing".

In a still earlier phase of control unit development, the basic functionality of control and regulation methods can be evaluated in a purely computer-based manner. For this purpose, a basic test model of the control unit is created in software, which can be tested without being embedded in a tester and without physical connection to the technical system to be controlled. In this phase, the test can be conducted such that the behavior of the basic test model as such, which is to say the internal states of the basic test model, or the behavior of the basic test model in interaction with a computer-based model of the later environment of the control unit, is observed and evaluated. Computer-based development environments, such as Simulink®, for example, exist for creating basic test models of control units and for creating the said models of the environment of the control units. Such development environments also allow testing of the basic test models in the modeled environment. For detailed tests of basic test models in modeled environments, there are in turn specialized products, such as, e.g., VEOS®. The said basic test models of control units can also be referred to as virtual control units, so-called "Virtual Electronic Control Units" (V-ECUs), especially in the field of control unit development in the automotive industry. In addition to the testing of basic functionality of control and regulation methods in an early phase of control unit development, basic test models can also be used to move certain tests of HIL simulations forward, and thus to keep the test scope small during the HIL test phase.

In the two first-mentioned examples of control unit development, namely HIL simulator and RCP tester, there is a tester in which a model is present, and this tester must be connected to an external device through the input/output interface so that the test can be performed. In the case of RCP, the tester contains a test model of the control unit, and is connected to the technical system to be controlled. In the case of HIL, the tester contains a test model of the technical system to be controlled, and is connected to a hardware implementation of the control unit. In both cases, a tester equipped for control unit development is provided, wherein in one case the control unit is tested as a test model, and in the other case the control unit is tested as a hardware implementation that can be connected externally.

As already indicated, in both cases the tester has an input/output interface through which the tester is connected to the technical system to be controlled or to the hardware implementation of the control unit to be tested. This input/output interface is connected in the tester to the model present in the tester, so that the model can communicate through the input/output interface with the technical system to be controlled or with the control unit to be tested.

One and the same tester can be used for different simulations. In other words, one and the same tester can be used with different models present in the tester and with different control units under test, or technical systems to be controlled, connected to the tester. It is evident that different channels of the input/output interface and different ways to control the input/output interface are required for different connected devices/systems and for different models. Accordingly, it is customary to produce specific connections between the input/output interface on one side and the model present in the tester on the other side prior to carrying out a specific simulation. This process of configuring connections between the input/output interface and the model present in the tester is resource-intensive. There is as yet no method that offers satisfactory support for this process.

SUMMARY OF THE INVENTION

It is therefore an object of the invention to provide an improved method for connecting the input/output interface of a tester equipped for control unit development to a model of a technical system present in the tester.

Exemplary embodiments of the invention comprise a method for connecting an input/output interface of a tester equipped for control unit development to a model of a technical system present in the tester using an already-existing basic test model of a control unit, wherein the input/output interface is designed for connecting a hardware implementation of the control unit or for connecting a technical system to be controlled, and the model to be connected to the input/output interface is a test model of the technical system to be controlled or a test model of the control unit. The method in this context has the following steps: Accessing the already-existing basic test model of the control unit, wherein the basic test model is designed for a purely computer-based basic test; extracting at least one communication requirement from the basic test model of the control unit; specifying, on the basis of the at least one communication requirement, at least one feature of a physical signal transmission that is suitable for the communication requirement; and configuring at least one connection between the input/output interface of the tester and the model present in the tester that permits physical signal transmission through the input/output interface in accordance with the at least one feature while satisfying the at least one communication requirement.

The method according to the invention makes it possible to use the abstract communication requirements present in a basic test model in order to permit physical communication between the tester and the control unit connected thereto or the system to be controlled connected thereto. In other words, the method according to the invention makes possible an implementation of the abstract communication requirements of the basic test model in a suitable configuration of the connection between the model present in the tester and the input/output interface of the tester, so that a physical signal transmission through the input/output interface that satisfies the abstract communication requirements becomes possible by means of the configuration with the interaction of the model present in the tester and the input/output interface. By extracting the communication requirements from the basic test model of the control unit and the corresponding specification of features of the physical signal transmission of the tester, it is possible to significantly reduce or entirely eliminate the participation of a human expert in the configuration of the said connections. The automatic configuration of the connections is based on the targeted evaluation of an already-existing basic test model. In control unit development to date, the already-existing basic test model has been disregarded as soon as the test phases with physical signal transmission have been reached. The use of the basic test model creates synergies between the different phases of control unit development. A basic test model used in a very early phase, such as a Virtual Electronic Control Unit (VECU), for example, is analyzed with regard to very specific parameters, namely with regard to the communication requirements, as a result of which the tester employed in a later development phase can be configured at least partially automatically. Through targeted extraction of specific features of a basic test model, the effort for the configuration of a tester used later can be significantly reduced. Consequently, configuration of the tester can take place more quickly, which significantly reduces the overall time for control unit development. Moreover, less expert knowledge is necessary during configuration of the tester, which in turn shortens development time and also reduces development costs.

The term "basic test model" can refer to a test model of the control unit that is used in an early phase of control unit development. In particular, the term "basic test model" can refer to a test model that is designed for purely computer-based testing of the functionality of the control unit. Consequently, therefore, the term denotes a test model of the control unit that is present in abstract form and as a rule is available prior to the performance of a test phase with a physical tester. In this respect, the communication requirements, as they are defined by the basic test model, are present in abstract form, and they are also extracted from the basic test model as such abstract communication requirements. As already mentioned above, one example of such a basic test model is a virtual electronic control unit (VECU).

As described above, physically present control unit prototypes are employed in HIL simulation in order to test the correct functioning of the control unit and, in particular, the correct functioning of the control unit software present in the control unit. By means of virtual validation and the additional use of virtual control units, the efficiency and test quality of HIL simulation are further improved. Virtual validation describes the use of PC-based simulation for validating, verifying, and testing control unit software. For HIL simulation, it provides the capability of creating and validating test scenarios in advance on a PC-based simulation platform, as well as configuring the simulation model. In addition, initial test scenarios can be run using virtual control units. Open-loop and closed-loop tests of the control unit software and system model can be run on the PC in this way with no connection to a real, physical system in order to detect errors and thereby improve the quality of the control unit software even before the actual HIL simulation. Time on the HIL simulator is used more efficiently as a result of this advancement of test creation and test preparation.

Even in early development phases, the VEOS® simulation platform allows PC-based simulation of individual software components of control units and of control unit networks. Users can continue to work in their customary work environment and re-use already-existing data, models, layouts, and configurations. The same V-ECUs, models, layouts, and simulations scenarios that are created and used for VEOS® can be used again in the HIL simulation, thus reducing the preparation effort for HIL tests.

If a necessary part of the control unit network is not present as real control unit hardware in an HIL scenario, this part can be made available in the form of a V-ECU and used for the HIL simulation. To this end, the control unit software can be present in the form of AUTOSAR software components. The V-ECU can be integrated directly into the HIL simulation so that a separate, labor-intensive repeat modeling of the software behavior in a behavioral model is eliminated. This re-use of already-existing control unit code saves the user development and validation effort.

V-ECUs can offer the same functions and software components as the final control units. They may be present in different forms depending on the requirements for the depth of detail of the tests, for instance they can be provided with individual control unit functions, or provided with many or all application software components, or provided with the fully integrated and configured application software, the runtime environment, the operating system, and hardware-independent basic software. Depending on the form, the scope of the communication requirement to be extracted can vary. The way in which the communication requirement is extracted can also depend on the form of the V-ECU. In the first form, the control unit function can be present as, e.g., a Simulink model or C code, from which the communication requirement (data type, data width, . . . ) is then extracted. In more detailed forms, additional descriptive structures can be added to the V-ECU, such as, e.g., XML files, from which additional or different communication requirements (for example, transmission frequency, latency, precision, unit, . . . ) can then also be extracted.

Many aspects of control unit real-time behavior can be simulated in a relatively simple and at the same time realistic manner with V-ECUs by reusing portions of software from the control unit development. Thus it is possible to achieve realistic results and improve functional quality even at an early stage, before the availability of the finished control unit. The software configurability of HIL systems and the capability for PC-based simulation in advance also help to reduce setup and startup times on the HIL simulator. The new technologies of virtual validation and the use of V-ECUs are thus finding their way into existing validation and testing processes for control unit software.

The configuring of the at least one connection between the input/output interface of the tester and the model present in the tester represents the creation and parameterization of a suitable connection between the input/output interface of the tester, implemented as hardware, and the software model present in the tester. Accordingly, the connection can also be described as a driver connection that permits communication between the model present in the tester, which is present as a software module or as a collection of software modules, and the input/output interface, which operates with physical signals.

The phrase, "that the input/output interface is designed for connecting a hardware implementation of the control unit or for connecting a technical system to be controlled, and that the model to be connected to the input/output interface is a test model of the technical system to be controlled or a test model of the control unit", can imply two different scenarios. First of all, the input/output interface can be designed for connecting the hardware implementation of the control unit, wherein the model to be connected to the input/output interface is then a test model of the technical system to be controlled. In this case, the step of configuring at least one connection is a configuration of at least one connection between the input/output interface of the tester and the test model of the technical system to be controlled. The physical signal transmission then takes place between the input/output interface of the tester and the hardware implementation of the control unit. Secondly, the input/output interface can be designed for connecting a technical system to be controlled, wherein the model to be connected to the input/output interface is then a test model of the control unit. In this case, the step of configuring at least one connection is a configuration of at least one connection between the input/output interface of the tester and the test model of the control unit. The physical signal transmission then takes place between the input/output interface of the tester and the technical system to be controlled. The step of configuring at least one connection can additionally make the configuration of the at least one connection dependent on whether the hardware implementation of the control unit is to be connected to the input/output interface from the outside or whether the test model of the control unit is present in the tester, and on the basis thereof can specify the transmission direction or directions of the at least one connection. The phrases, "the connected hardware implementation of the control unit or of the connected technical system", also include the case in which the device to be connected to the tester is in turn a simulation device that has a hardware interface for connection to the input/output interface of the tester and a software model of the control unit or of the connected technical system. The phrase "for connecting a hardware implementation of the control unit" includes the case of connecting a simulation device having a physical interface and a software implementation of the control unit functionality connected to the physical interface. Analogously, the phrase "for connecting a technical system to be controlled" includes the case of connecting a simulation device having a physical interface and an implementation in the form of a model of the technical system to be controlled that is connected to the physical interface.

The term "tester" describes a unit that is physically present, which is to say a concrete tester, wherein the unit has a physical input/output interface, such as, e.g., a terminal block for connecting various cables. The term tester should not imply here that this unit has exactly one element. The tester can have multiple elements, such as, e.g., one or more connection module(s) and one or more computer(s) that make(s) its/their computing capacity available.

The term "input/output interface" can refer to the totality of the parts of the physical connection structure of the tester to which it is possible to connect, for test purposes, hardware implementations of control units and/or technical systems to be controlled.

Using the basic test model for configuration of the tester can also produce efficiency improvements for the entire control unit development process. It is possible not only to use the method described for connecting the input/output interface of the tester to the model present in the tester, but also to use an analogous method, or the same method, for creating the final control unit. This means that an input/output interface of the control unit can be connected, on the basis of the communication requirements of the basic test model, to the software that is present in the control unit and contains the control or regulation algorithm of the control unit. It is possible here that the method is carried out only once and that the results are used for configuration of the control unit as well as for configuration of the tester. As a result, an improvement in efficiency is achieved when the process of control unit development is considered as a whole. Moreover, the compatibility between the tester and the connected control unit can be improved in this way for the case of HIL simulation because both devices are based on the same basic test model with respect to the configuration of their input/output interface and on the same method for connecting the applicable input/output interface to the rest of the device in question.

According to an embodiment, the step of specifying at least one feature of a physical signal transmission has the following steps: Outputting the at least one communication requirement to an external instance; and receiving a declaration from the external instance, wherein the declaration defines the at least one feature associated with the at least one communication requirement. In other words, after extracting the at least one communication requirement from the basic test model of the control unit, the method for connecting the input/output interface turns to an external instance in order to specify the at least one feature of the physical signal transmission by means of the at least one declaration received from the external instance. In this way, the method prepares the information extracted from the basic test model for an external instance in such a manner that this external instance can directly influence the specification of the at least one feature of the physical signal transmission by making a declaration. Therefore, through targeted extraction and outputting of the at least one communication requirement, the method makes it possible to specify the at least one feature of the physical signal transmission with little effort on the part of the external instance. The concept of the feature associated with the at least one communication requirement refers to the feature of the physical signal transmission that is suitable for the communication requirement, wherein the feature is specified on the basis of the at least one communication requirement.

According to an embodiment, the external instance is a user or an external communication program. In other words, the said declaration from the external instance can be the result of human input. The user of the method, which is to say normally the test engineer, who attends or monitors the configuring of the connections between the input/output interface of the tester and the model present in the tester, can influence the specification of the at least one feature of the physical signal transmission in this way and thus guide the process of test configuration at a relatively early stage of the method. This task can also be performed by an external configuration program instead of by a human user. This program can contain associations that algorithmically assign declarations to the communication requirements that are output, which declarations then in turn define the features of the physical signal transmission. In this way, the steps of extracting the at least one communication requirement and specifying the at least one feature of the physical signal transmission can be carried out completely automatically, which is to say without human assistance.

According to an embodiment, the step of specifying at least one feature of a physical signal transmission has the following steps: Accessing a data record that contains correlations between communication requirements and features of physical signal transmission; and selecting the at least one feature of the physical signal transmission on the basis of the correlations. In this case, for specifying the at least one feature of the physical signal transmission, an existing data record is accessed in order to specify the at least one feature of the physical signal transmission in a suitable manner on the basis of the extracted at least one communication requirement. The data record used for this purpose, which contains the said correlations, can be part of the basic test model or can be present as a data record used by default, for example as part of a software library, so that the method has direct access to this data record. In this case communication with an external instance is not absolutely necessary. It can also be the case, however, that the accessing of the data record that contains correlations between communication requirements and features of physical signal transmission, and the above-described communication with the external instance are present in combination. For example, it is possible that two or more possibilities are selected for the at least one feature of the physical signal transmission on the basis of the correlations, and that these two or more possibilities are output to the external instance, wherein the receiving of the declaration from the external instance includes the receiving of a selection from the two or more possibilities. In this way, the interaction for the external instance, such as, e.g., for the test engineer, can be simplified still further.

According to an embodiment, the step of specifying at least one feature of a physical transmission only takes place with the use of the at least one communication requirement or with the use of the at least one communication requirement in combination with additional data present in the basic test model. In other words, the information present in the basic test model is processed algorithmically such that the at least one feature of the physical signal transmission is specified by the method for connecting the input/output interface without there being any need to communicate with an external instance for this specification.

According to an embodiment, the step of configuring the at least one connection between the input/output interface of the tester and the model present in the tester has the following steps: Outputting multiple possible proposed connections between the input/output interface of the tester and the model present in the tester to a user for selection; and receiving from the user the selection of the at least one connection. A connection between the input/output interface of the tester and the model present in the tester is distinguished in that the communication through this connection takes into account not only the extracted at least one communication requirement, but also the specified at least one feature of the physical signal transmission. In other words, this said connection makes possible the transition between the input/output interface present as hardware and the model present as software in the tester in such a manner that the extracted, abstract communication requirement and the specified, concrete physical signal transmission are made possible at the same time. Normally, there are multiple possible connections for the combination of at least one communication requirement and at least one feature of the physical signal transmission. It is possible in this context that the at least one connection is configured by the method for connecting the input/output interface without involving a user. It is also possible, however, as described above by the additional steps, for the method to output multiple possible proposed connections to the user for selection and to receive a corresponding selection made by the user. In this way, it is possible that the user exerts an influence on the configuration process at a fairly late stage of the method. In this way, he can ensure, using his expert knowledge, that the connection or the totality of all connections is or are such that the test runs in an especially effective manner, for example with especially high speed and/or with especially high precision.

According to an embodiment, the step of configuring the at least one connection between the input/output interface of the tester and the model present in the tester has the following steps: Outputting exactly one possible proposed connection between the input/output interface of the tester and the model present in the tester to a user for selection; and receiving a confirmation or a rejection from the user. In this way, only a yes/no decision is required of the user, thus further simplifying the configuration process for the user. These steps can be performed iteratively, with exactly one additional possible proposed connection being presented to the user for confirmation or rejection after rejection of the one possible proposed connection.

According to an embodiment, the input/output interface of the tester has a multiplicity of ports, and the tester has a multiplicity of input/output functions that are connected to the model present in the tester and to the input/output interface. In this design, the step of configuring the at least one connection between the input/output interface of the tester and the model present in the tester has the following steps: Selecting at least one port from the multiplicity of ports; and parameterizing at least one input/output function from the multiplicity of input/output functions, wherein the at least one input/output function controls the at least one port and wherein the parameterization configures the at least one input/output function such that during testing it carries out physical signal transmission through the input/output interface in accordance with the at least one feature while satisfying the at least one communication requirement. Input/output functions are one possibility for the link between the model on the one side and the physical input/output interface on the other side. They represent a bridge between the physical signals present on the input/output interface and the model present in software. In order to do justice here both to the features of the physical signal transmission and to the abstract communication requirements, the input/output functions are parameterized, which is to say they are matched to the communication requirement(s) and the feature/features of the physical signal transmission. After this matching, the input/output functions are able to control the at least one port, which is to say to initiate outgoing signals on the port and/or to receive incoming signals on the port. In this process, the input/output functions convert physical signals into logic signals to be processed by software and vice versa.

According to an embodiment, the at least one communication requirement is a parameter or a parameter set including data type, data width, physical unit, port type, transmission frequency, latency, value range, and value precision. The term "port type" is understood here as the distinction between an input port and an output port. Furthermore, the port type can also include the distinction between signals that are transmitted continuously and signals that indicate certain events, such as, e.g., pulse signals, configuration signals, etc. Data type is understood to mean the kind of data with which the basic test model operates for a specific communication requirement, such as, e.g., integer, float, etc. The data type can be an indication of the value range and value precision, although these parameters can also differ quite sharply from the value range or value precision that is possible with the data type. Data width is understood to mean whether a scalar or a vector is involved, which is to say whether one value or a multiplicity of values is involved. If a vector is involved, the data width can also include the information on the vector size.

According to an embodiment, the at least one feature of the physical signal transmission is from the group including signal transmission by voltage, signal transmission by current, physical voltage range, physical current range, digital transmission, analog transmission, transmission by pulse width modulation, transmission by pulse frequency modulation, transmission by data bus, data transmission rate. These features allow a selection of the physical signal transmission with respect to the transmission type (analog or digital), with respect to the signal-carrying physical quantity (current or voltage), with respect to the information-carrying quantity (absolute value or pulse width or pulse frequency) and with respect to the time characteristics of the transmission or the bundling with other transmissions (for example, over a data bus).

The specification of the at least one feature of the physical signal transmission on the basis of the at least one communication requirement can be based on a great many considerations. A few such considerations are named in the following by way of example. When a value with low value precision is to be transmitted, a transmission by voltage is appropriate. When a corresponding electric power is also to be transmitted with the transmission of a value, a transmission by pulse width modulation is appropriate. When a value with great value precision is to be transmitted, a transmission by data bus is appropriate. When a signal is to be transmitted over a great distance, possibly in an environment with a lot of interference, a transmission by data bus is likewise appropriate. If, taken as a whole, only a small amount of information is to be transmitted, transmission by data bus is not necessarily appropriate because of the high complexity and costs. In like manner, a data transmission by data bus is not appropriate when a value with very low or strictly defined latency is to be transmitted. It is evident that there are many such considerations that provide suitable or less suitable features of the physical transmission for specific communication requirements. As discussed in detail above, such considerations can be represented by means of a data record with correlations between communication requirements and features of physical signal transmissions, which can be accessed by machine. It is also possible that such considerations are embedded in external configuration programs, and the features of the physical signal transmission are specified by querying the same. In addition it is possible, as mentioned above, that communication requirements are output to the user in order to solicit his input with regard to the specification of the features of the physical signal transmission. As was also explained in detail above, these approaches can be correlated with one another, with the specification occurring partly in a machine-based manner and partly in a user-assisted manner.

According to an embodiment, the step of extracting at least one communication requirement of the control unit under test from the basic test model of the control unit includes the extraction of all communication requirements of the control unit under test, and the step of specifying at least one feature of a physical signal transmission includes the specification of a multiplicity of features of the physical signal transmission, wherein the multiplicity of features covers all communication requirements. In this way, in the step of configuring at least one connection, the method configures all connections between the input/output interface of the tester and the model present in the tester that are necessary for complete communication between the input/output interface and the model present in the tester of a technical system in order to test the functionality of the control unit. In this embodiment, the steps of extracting the communication requirements and specifying the features of the physical signal transmission can be performed iteratively, with each of these steps relating to a subset of the totality of all communication requirements at each execution. It is also possible, however, that the method simultaneously processes all communication requirements in an integral manner for suitable features of the physical signal transmission.

According to an embodiment, the step of configuring the at least one connection between the input/output interface of the tester and the model present in the tester includes the configuration of a multiplicity of connections between the input/output interface of the tester. In particular, the step of configuring can include the configuration of such a multiplicity of connections between the input/output interface of the tester that all communication requirements of the basic test model can be handled through this multiplicity of connections. Moreover, it is possible that the step of configuring the at least one connection between the input/output interface additionally has the following step in this case: Combining at least two connections that share a specific port of the input/output interface by defining an order of access to the specific port. The defining of the order of access to the specific port can include the definition of different transmission channels on the specific port through a multiplexed access, such as, e.g., time multiplex or frequency multiplex. One example of such multiplexed access to a specific port is bus communication on the specific port. In this process, multiple connections share the available hardware resource in accordance with a defined protocol. In this way, the number of hardware resources required for the physical signal transmission can be reduced or kept small.

According to an embodiment, the tester is a hardware-in-the-loop simulation device, and the input/output interface is designed to connect the hardware implementation of the control unit, and the model to be connected to the input/output interface is the test model of the technical system to be controlled.

According to an embodiment, the tester is a rapid control prototyping tester, and the input/output interface is designed to connect the technical system to be controlled, and the model to be connected to the input/output interface is the test model of the control unit. In this case, the test model of the control unit of the rapid control prototyping tester can correspond to the already existing basic test model.

According to an embodiment, the step of configuring at least one connection between the input/output interface of the tester and the model present in the tester has the following step: Configuring at least one faulty connection between the input/output interface of the tester and the model present in the tester, wherein the at least one faulty connection is configured to simulate transmission errors and/or interference effects. In this way, it is possible in the later simulation to test cases in which the communication between the control unit and the technical system to be controlled does not function perfectly, such as, e.g., in the case of a cable break, a short circuit, electromagnetic interference fields, or other environmental conditions affecting the transmission. In this context, the configuring of the at least one faulty connection can include the selection of a preconfigured port of the input/output interface that is designed to simulate transmission errors and/or interference effects. Alternatively, the connection between the input/output interface, such as, for example, the input/output function employed, can be designed such that transmission errors and/or interference effects are simulated.

Exemplary embodiments of the invention also comprise a computer program product and computer program for carrying out a method for connecting an input/output interface of a tester designed for control unit development, wherein the computer program product is designed such that a method as defined in one of the embodiments described above is carried out when the computer program is executed.

Exemplary embodiments of the invention also comprise a tester that has an input/output interface for connecting a hardware implementation of a control unit or for connecting a technical system to be controlled and has a test model of the technical system to be controlled or a test model of the control unit. The tester here is equipped to carry out a method according to one of the above-described embodiments. To this end, the tester can have a processor and a memory, wherein a computer program is stored in the memory that, when executed by the processor, results in a method according to one of the above-described embodiments. The processor and the memory can be provided for the provision and execution of the method according to the invention as well as for the provision and execution of the test program executed later. It is also possible, however, for the tester to have multiple modules. For example, a test module that has the input/output interface and the model of the technical system can have a processor and a memory for carrying out the simulation, while a configuration module that has a memory and a processor for carrying out the method according to the invention can be implemented separately. This configuration module can be a separate computer that is connected to the test module.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
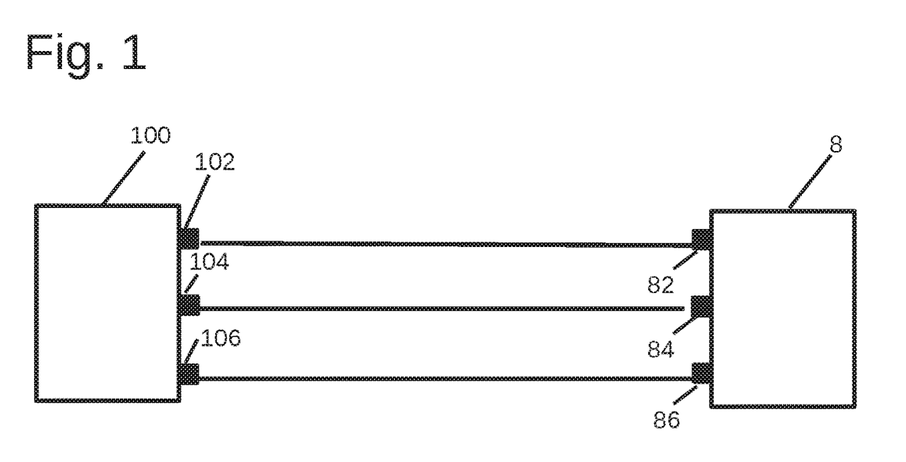
FIG. 1 shows the combination of an exemplary basic test model and a model of a technical system to be controlled.
Figure 2:
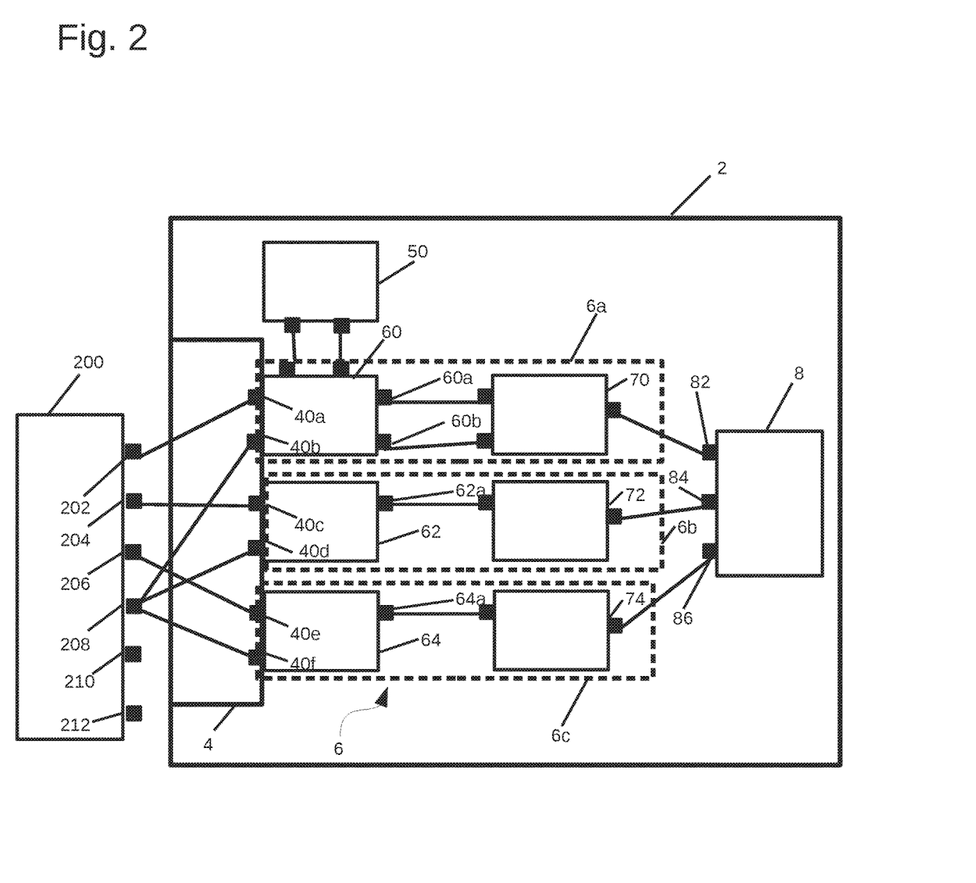
FIG. 2 shows an exemplary combination of a tester according to an exemplary embodiment of the invention and a hardware implementation of the control unit.

Described below by way of example with reference to FIGS. 1 and 2 is the way in which a tester that can test a hardware implementation of a control unit is configured according to one embodiment of the method according to the invention on the basis of a basic test model of the control unit. To this end, the block diagrams that are shown are described first, after which the exemplary embodiment of the method according to the invention is described.

FIG. 1 shows a basic test model 100 of a fan control. The fan control is an example of a control unit in the meaning of the present invention. The basic test model 100 is present in software and is intended and suitable for a purely computer-based basic test of the fan control. The basic test model 100 can also be referred to as a virtual control unit or as a virtual fan control.

The basic test model 100 has a first communication interface 102, a second communication interface 104, and a third communication interface 106. Through the first communication interface 102, the basic test model 100 communicates a power value, which, in the basic test, encodes the power delivered by the fan. Through the second communication interface 104, the basic test model 100 receives a temperature value, which, in the basic test, encodes the temperature received by a temperature sensor. Through the third communication interface 106, an indication of the position of the fan's on/off switch is received in the basic test.

FIG. 1 also shows the test model 8 of the technical system to be controlled by the fan control. In the exemplary embodiment from FIG. 1, the test model 8 is a combination of all entities to which the fan control is connected in actual operation. In this regard, the test model 8 is a complete environment model of the fan control, also referred to as a system model. In the present example, the test model 8 is the combination of a fan, a temperature sensor either located in the fan or located separately, and an on/off switch.

The test model 8 has a first communication interface 82, a second communication interface 84, and a third communication interface 86. The first communication interface 82 of the test model 8 is connected to the first communication interface 102 of the basic test model 100 and is set up to receive the power value described above. The second communication interface 84 of the test model 8 is connected to the second communication interface 104 of the basic test model 100 and is set up to output the temperature value described above. The third communication interface 86 of the test model 8 is connected to the third communication interface 106 of the basic test model 100 and is set up to output the on/off value described above.

Due to the provision of the basic test model 100 of the fan control and of the test model 8 of the environment of the fan control, a purely computer-based basic test can be performed at a very early stage of the development of the fan control in which the functionality of the fan control can be tested and analyzed at the software level. In this context, the following conventions apply for the communication between the basic test model 100 of the fan control and the test model 8 of the environment of the fan control. The power value has a value between 0 and 1, where the instantaneous concrete value between these limits indicates the intensity at which the fan is supposed to run. The temperature value represents the instantaneous temperature as a floating-point number in ° C. The on/off value is a binary value and indicates whether the ventilation is currently turned completely off or whether it should be running.

FIG. 2 shows a tester 2, in the present case an HIL simulator, to which is connected a hardware implementation 200 of the fan control for which the basic test model 100 is shown in FIG. 1.

The hardware implementation 200 of the fan control, also referred to as fan control 200, is a device that is available at a fairly late stage of development. In particular, the fan control 200 is a device that represents a fully functional prototype of the fan control that will later be used in production. The fan control 200 has six ports, namely a first port 202, a second port 204, a third port 206, a fourth port 208, a fifth port 210, and a sixth port 212. The physical signal transmission of the fan control 200 and the electrical power supply take place through these six ports. The first port 202, the second port 204, and the third port 206 are used for communication with the environment of the fan control and for supplying the fan with electric power, as is described in detail below. The fourth port 208 serves as a reference port here. Through the fifth port 210, the fan control 200 is supplied with electrical energy in the form of an operating voltage. Ground or zero potential is present at the sixth port 212. The fan control 200 is connected to the tester 2 through the first to fourth ports 202, 204, 206, 208.

The tester 2 has an input/output interface 4. In general, testers such as the HIL simulator shown here have a multiplicity of ports as part of the input/output interface. For the sake of clarity, only the six ports of the input/output interface that are employed are shown in FIG. 2, namely the first port 40a, the second port 40b, the third port 40c, the fourth port 40d, the fifth port 40e, and the sixth port 40f of the input/output interface 4. The first port 40a is connected to the first port 202 of the fan control 200. The third port 40c is connected to the second port 204 of the fan control 200. The fifth port 40e is connected to the third port 206 of the fan control 200. The second port 40b, the fourth port 40d, and the sixth port 40f are connected to the fourth port 208 of the fan control 200.

In addition, the tester 2 contains the test model 8 of the environment of the fan control, as described in relation to FIG. 1. Once again, the test model 8 of the environment of the fan control has the first communication interface 82, the second communication interface 84, and the third communication interface 86.

The input/output interface 4 is connected to the test model 8 of the environment of the fan control by a plurality of connections, which are labeled as a whole with reference number 6. The connections comprise a first connection 6a, a second connection 6b, and a third connection 6c, which each have an input/output function and a scaling module. The first connection 6a has a first input/output function 60 and a first scaling module 70. The first input/output function 60 is connected to the first port 40a and the second port 40b of the input/output interface. In addition, the first input/output function 60 has two communication interfaces 60a and 60b, through which it communicates with the first scaling module 70, which in turn communicates with the first communication interface 82 of the test model 8. The second connection 6b has a second input/output function 62 and a second scaling module 72. The second input/output function 62 is connected to the third port 40c and the fourth port 40d of the input/output interface 4 and communicates through a communication interface 62a with the second scaling module 72, which in turn is connected to the second communication interface 84 of the test model 8. The third connection 6c has a third input/output function 64 and a third scaling module 74. The third input/output function 64 is connected to the fifth port 40e and the sixth port 40f of the input/output interface 4, and communicates with the third scaling module 74 through a communication interface 64a, wherein the third scaling module 74 is connected to the third communication interface 86 of the test model 8. In addition, the first input/output function 60 is connected to a load circuit 50.

Configuring of the connections 6 on the basis of the basic test model 100 of the fan control shown in FIG. 1 and described above according to an exemplary embodiment of the method according to the invention is described below. As mentioned above in relation to FIG. 1, the convention for the communication between the basic test model 100 and the test model 8 is as follows. The power value is communicated by a value between 0 and 1. The temperature value is communicated by a floating-point number in ° C. The on/off value is communicated by a binary value. These conventions, which are also referred to as communication requirements, are extracted from the basic test model 100 by the method for connecting the input/output interface.

In addition, the following communication requirements are extracted from the basic test model 100: The power value may have a maximum deviation of 0.05 from the desired value. The temperature value has a value range between −15° C. and 70° C. The temperature value must be present with a precision of 0.1° C. The temperature value must be transmitted at least once per second. The on/off value must be transmitted at least ten times per second. For the power value, the value of 1 corresponds to a power output of the fan control to the fan of 200 watts.

On the basis of these communication requirements, the exemplary embodiment of the method according to the invention specifies multiple features of the physical signal transmission, wherein these features are selected such that the communication requirements are satisfied. The exemplary embodiment of the method according to the invention specifies that the power provided to the fan by the fan control is provided as a pulse width modulated voltage value. In this context, the voltage oscillates between a value of 12V and a value of 0V, where the degree of utilization, which is to say the ratio of the duration of the presence of the voltage of 12V to the total duration of a period, also referred as duty cycle, corresponds to the power value. In addition, the method specifies that the temperature value is transmitted by a voltage signal, where the level of the voltage is between 0V and 10V, with 0V corresponding to a temperature value of −15° C. and 10V corresponding to a temperature value of 70° C. Furthermore, the method specifies that the transmission of the on/off value is likewise transmitted by a voltage, where a voltage of greater than 2.5V encodes the on state and a voltage of less than 2.5V encodes the off state. The method has thus specified the features of the physical signal transmission on the basis of the communication requirements.

As described above in general, the method can undertake these specifications purely on the basis of the communication requirements and existing correlations or selection algorithms. It is also possible, however, for the method to undertake these specifications in cooperation with an external instance, such as, e.g., a user. In this case, the user can incorporate his knowledge of suitable features of the physical signal transmission and/or his knowledge of the hardware implementation 200 of the control unit in the process. Mixed methods are also possible, wherein individual features are specified fully automatically while other features are specified interactively by a user. It is also possible that the method specifies all features, but these can then be modified by the user.

On the basis of the above-discussed communication requirements and the above-discussed specified features of the physical signal transmission, the method now configures the connections 6 in the tester 2. The first connection 6a is configured as follows. The first input/output function 60 is created, which is set up for processing an incoming pulse width modulated signal. The first input/output function 60 analyzes the incoming signal with regard to frequency and duty cycle, and passes the signal on to the load circuit 50, where the electrical energy of the input signal is consumed, for example by means of one or more load resistances. The first input/output function delivers the information on the frequency and the duty cycle of the pulse width modulated signal through the communication interfaces 60a and 60b to the first scaling module 70, which is also created by the method as part of the configuration. From this information, the scaling module 70 calculates a power value between 0 and 1, as the test model 8 expects, and outputs this value to the first communication interface 82 of the test model 8.

The second connection 6b is configured as follows. The second input/output function 62 is created, which is set up to receive the information about a voltage value on the communication interface 62a and to output a corresponding voltage between the third port 40c and the fourth port 40d of the input/output interface 4. In addition, the second scaling module 72 is created, which calculates a voltage value between 0V and 10V from the temperature value between −15° C. and 70° C. output by the test model 8 on the basis of a linear function, and forwards this value to the second input/output function 62.

The third connection 6c is configured as follows. A third input/output function 64 is created that is set up to output either a value of 5V or a value of 0V between the fifth port 40e and the sixth port 40f of the input/output interface 4. In addition, a third scaling module 74 is created that in the present case forwards the on/off value, as a binary value as it is output by the third communication interface 86 of the test model 8, to the communication interface 64a of the third input/output function 64 as a binary value. Since the third scaling module 74 in the context of a binary value is responsible strictly for forwarding of the value, this module can also be omitted. In general, it is also possible for the scaling functionality of the scaling modules to be integrated into the relevant input/output functions.

After configuration of the connections, a functioning signal transmission chain exists between the hardware implementation 200 of the fan control and the test model 8 of the environment of the fan control, so that the fan control 200 can be tested extensively. To this end, the tester 2 has the functionality to observe and analyze the behavior of the test model 8 and of the fan control 200 in a very wide variety of operating situations through appropriate signals, pulses, and triggers.

For configuration of an RCP simulation, the method can be executed in similar fashion. In this case the tester is connected to a hardware environment of the fan control. In particular, the tester can be connected by means of its input/output interface to a fan and to an operating switch for the fan as well as to a temperature sensor. The model present in the tester can be the basic test model 100 or a further developed model of the fan control. On the basis of the information present in the basic test model 100, suitable connections can be created between the model of the fan control and the input/output interface so that a functioning signal transmission chain is formed between the model of the fan control and the environment of the fan control. The configured connections can correspond essentially to the connections shown in FIG. 2 and described above, but with the direction of signal transmission reversed.

Figure 3:
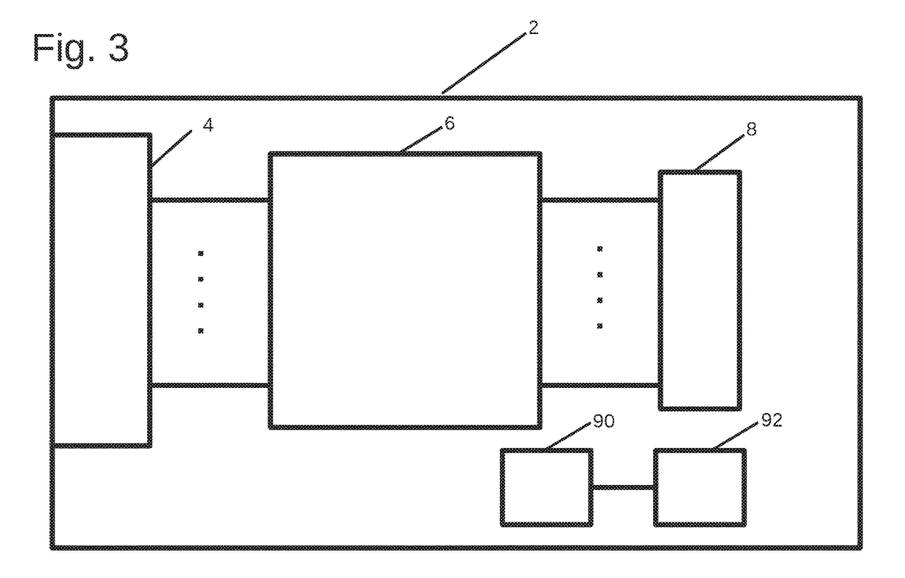
FIG. 3 shows an exemplary tester according to one embodiment of the invention.

Shown in FIG. 3 is another exemplary embodiment of a tester 2 according to an embodiment of the invention. The elements described above—input/output interface 4, connections 6, and test model 8—are shown in a simplified representation as rough function blocks. In comparison to FIG. 2, a processor 90 and a memory 92 are additionally represented in FIG. 3. The method described above can be executed on the processor 90. The instructions for the method and the decision rules or algorithms for the features of the physical signal transmission can be stored in the memory 92. The processor 90 can access the memory 92 and carry out the method on the basis of the information present in the memory 92.

Figure 4:
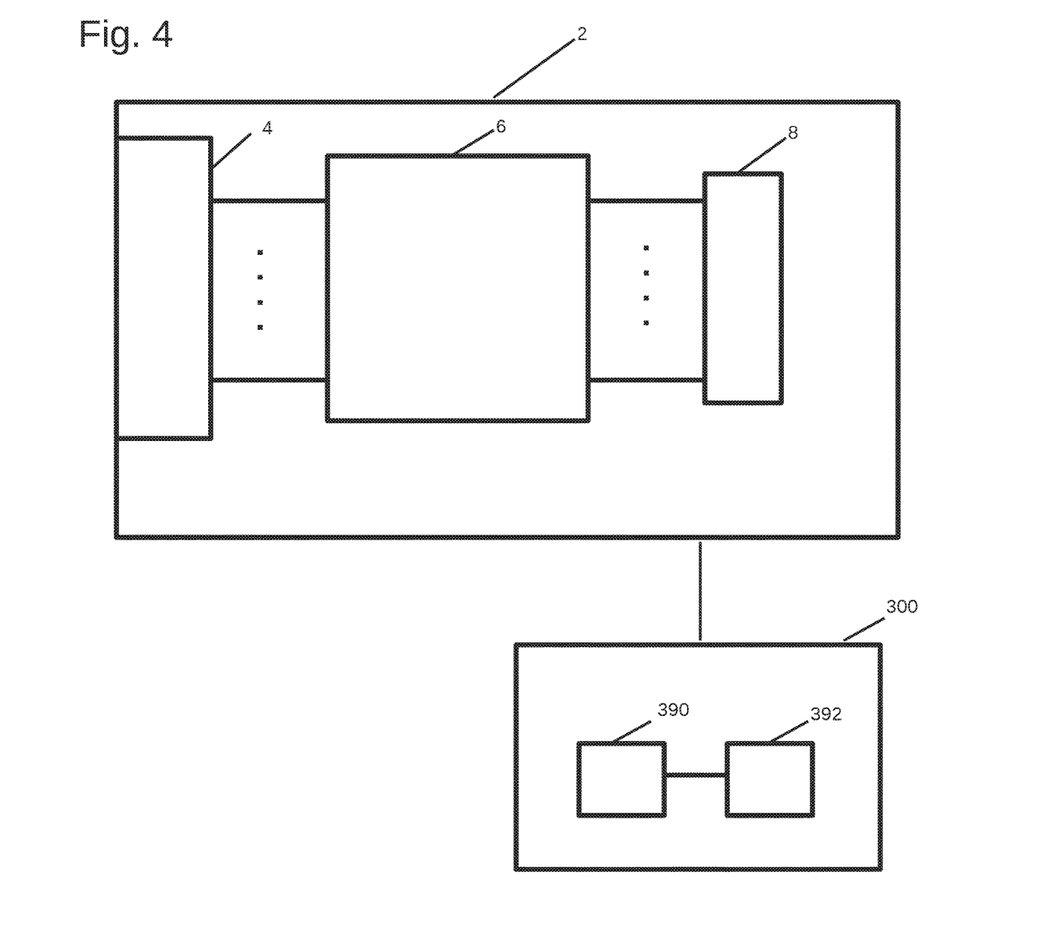
FIG. 4 shows an exemplary tester according to an embodiment of the invention, in combination with an external configuration computer.

A modification is shown in FIG. 4, where a configuration computer 300 is connected to the tester 2. The configuration computer 300 has a processor 390 and a memory 392. It can carry out the above-described method from outside of the tester, and in doing so configure the connections 6 in the tester 2 through the connection between the configuration computer 300 and the tester 2.

Emphasis is placed on the fact that both the tester 2 and the configuration computer 300 can have input and/or output devices such as, e.g., a monitor, a keyboard, a touch pad and/or a mouse, so that a user can exert influence on the method as described in detail above.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for connecting an input/output interface of a tester equipped for control unit development to a model of a technical system present in the tester using an already-existing virtual control unit of a control unit, the input/output interface connecting a hardware implementation of the control unit or a technical system to be controlled, the model to be connected to the input/output interface being a test model of the technical system to be controlled or a test model of the control unit, the method comprising:
   accessing the already-existing virtual control unit of the control unit, the already-existing virtual control unit being designed for a purely computer-based basic test;
   extracting at least one communication requirement from the already-existing virtual control unit of the control unit;
   specifying, on a basis of the at least one communication requirement, at least one feature of a physical signal transmission that is suitable for the communication requirement; and
   configuring at least one connection between the input/output interface of the tester and the model present in the tester that permits physical signal transmission through the input/output interface in accordance with the at least one feature while satisfying the at least one communication requirement.

2. The method according to claim 1, wherein said specifying the at least one feature of the physical signal transmission comprises:
   outputting the at least one communication requirement to an external instance; and
   receiving a declaration from the external instance,
   wherein the declaration defines the at least one feature associated with the at least one communication requirement.

3. The method according to claim 2, wherein the external instance is a user or an external configuration program.

4. The method according to claim 1, wherein said specifying the at least one feature of the physical signal transmission comprises:
   accessing a data record that contains correlations between communication requirements and features of physical signal transmission; and
   selecting the at least one feature of the physical signal transmission on the basis of the correlations.

5. The method according to claim 1, wherein said configuring the at least one connection between the input/output interface of the tester and the model present in the tester comprises:
   outputting multiple possible proposed connections between the input/output interface of the tester and the model present in the tester to a user for selection; and
   receiving from the user the selection of the at least one connection.

6. The method according to claim 1, wherein the input/output interface of the tester has a plurality of ports,
   wherein the tester has a plurality of input/output functions connected to the model present in the tester and to the input/output interface, and wherein the step of said configuring the at least one connection between the input/output interface of the tester and the model present in the tester comprises:
   selecting at least one port from the plurality of ports; and
   parameterizing at least one input/output function from the plurality of input/output functions,
   wherein the at least one input/output function controls the at least one port, and
   wherein the parameterization configures the at least one input/output function such that, during testing, the tester carries out physical signal transmission through the input/output interface in accordance with the at least one feature while satisfying the at least one communication requirement.

7. The method according to claim 1, wherein the at least one communication requirement is a parameter or a parameter set including: data type, data width, physical unit, port type, transmission frequency, latency, value range, and/or value precision.

8. The method according to claim 1, wherein the at least one feature of the physical signal transmission includes: signal transmission by voltage, signal transmission by current, physical voltage range, physical current range, digital transmission, analog transmission, transmission by pulse width modulation, transmission by pulse frequency modulation, transmission by data bus, and/or data transmission rate.

9. The method according to claim 1, wherein said extracting the at least one communication requirement of the control unit under test from the virtual control unit of the control unit comprises extraction of all communication requirements of the control unit under test,
   wherein said specifying the at least one feature of the physical signal transmission comprises a specification of a plurality of features of the physical signal transmission, and
   wherein the plurality of features covers all communication requirements.

10. The method according to claim 9, wherein said configuring the at least one connection between the input/output interface of the tester and the model present in the tester comprises a configuration of a plurality of connections between the input/output interface of the tester, and comprises:
    combining at least two connections that share a specific port of the input/output interface by defining an order of access to the specific port.

11. The method according to claim 1, wherein the tester is a hardware-in-the-loop simulation device, and
    wherein the input/output interface is designed to connect the hardware implementation of the control unit and the model to be connected to the input/output interface is the test model of the technical system to be controlled, or
    wherein the tester is a rapid control prototyping tester, and the input/output interface connects the technical system to be controlled and the model to be connected to the input/output interface is the test model of the control unit.

12. The method according to claim 1, wherein the tester is a rapid control prototyping tester,
wherein the input/output interface connects the technical system to be controlled,
wherein the model to be connected to the input/output interface is the test model of the control unit, and
wherein the test model of the control unit of the rapid control prototyping tester corresponds to the already-existing virtual control unit model.

13. The method according to claim 1, wherein said configuring the at least one connection between the input/output interface of the tester and the model present in the tester comprises:
configuring at least one faulty connection between the input/output interface of the tester and the model present in the tester, wherein the at least one faulty connection is configured to simulate transmission errors and/or interference effects, and/or a cable break and/or a short circuit and/or electromagnetic interference fields and/or environmental influences.

14. A computer program product and a computer program for carrying out the method for connecting the input/output interface of the tester equipped for control unit development that carries out the method according to claim 1 when the computer program is executed.

15. The tester equipped for control unit development comprising:
the input/output interface for connecting the hardware implementation of the control unit or for connecting the technical system to be controlled; and
the test model of the technical system to be controlled or the test model of the control unit,
wherein the tester carries out the method according to claim 1.

16. The method according to claim 1, wherein said specifying the at least one feature of the physical transmission only takes place with a use of the at least one communication requirement or with the use of the at least one communication requirement in combination with additional data present in the already-existing virtual control unit.

17. The method according to claim 1, wherein said configuring the at least one connection between the input/output interface of the tester and the model present in the tester comprises:
outputting exactly one possible proposed connection between the input/output interface of the tester and the model present in the tester to a user for selection; and
receiving a confirmation or a rejection from the user.

18. The method according to claim 10, wherein said defining the order of access to the specific port comprises defining different transmission channels on the specific port through a multiplexed access.

19. A system, comprising:
a control unit or a technical system having an existing virtual control unit, the existing virtual control unit having at least one communication requirement;
a tester connected to the control unit or the technical system, the tester comprising:
an input/output interface connected to the control unit or the technical system; and
a test model to be connected to the input/output interface, wherein the tester is configured to:
access the existing virtual control unit of the control unit or the technical system;
extract the at least one communication requirement from the existing virtual control unit;
specify, based on the at least one communication requirement, at least one feature of a physical signal transmission; and
configure at least one connection between the input/output interface of the tester and the test model to permit the physical signal transmission through the input/output interface in accordance with the at least one feature of the physical signal transmission.

* * * * *